(12) United States Patent
Kim et al.

(10) Patent No.: US 8,546,799 B2
(45) Date of Patent: Oct. 1, 2013

(54) ORGANIC LIGHT EMITTING DISPLAY APPARATUS

(75) Inventors: Mu-Gyeom Kim, Yongin (KR); Chang-Mo Park, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 218 days.

(21) Appl. No.: 13/137,531

(22) Filed: Aug. 24, 2011

(65) Prior Publication Data

US 2012/0056174 A1    Mar. 8, 2012

(30) Foreign Application Priority Data

Sep. 6, 2010    (KR) .................. 10-2010-0087033

(51) Int. Cl.
*H01L 29/10*    (2006.01)
(52) U.S. Cl.
USPC ............................................................ 257/43
(58) Field of Classification Search
USPC ............................................................ 257/43
See application file for complete search history.

(56) References Cited

U.S. PATENT DOCUMENTS 4,316,049 A    2/1982    Hanak
2003/0015728 A1    1/2003    Bosco et al.

FOREIGN PATENT DOCUMENTS

| KR | 10-2005-0059637 A | 6/2005 |
| KR | 10-2007-0105583 A | 10/2007 |
| KR | 10-2008-0107221 A | 12/2008 |
| KR | 10-2009-0084708 A | 8/2009 |

OTHER PUBLICATIONS

Jens Reemts et al., Persistent photoconductivity in highly porous ZnO films, Journal of Applied Physics 101, 013709 (2007), pp. 013709-1-013709-5.

*Primary Examiner* — Anthony Ho
(74) *Attorney, Agent, or Firm* — Lee & Morse, P.C.

(57) ABSTRACT

An OLED apparatus including a substrate with a lower active layer thereon and including an oxide semiconductor for generating current in response to light; an etching prevention layer on an upper portion of the lower active layer and including a contact hole; a source/drain electrode on the etching prevention layer and electrically connected to the lower active layer through the contact hole; an upper charging electrode on the etching prevention layer and overlapping the lower active layer; a light emitting layer contacting the upper charging electrode for generating light; and a cathode electrode facing the upper charging electrode, wherein the light emitting layer is configured to be driven and emit light in response to a driving voltage applied to the upper charging electrode, and the lower active layer is configured to store current in the oxide semiconductor in response to the driving voltage applied to the upper charging electrode.

23 Claims, 6 Drawing Sheets

(a) → CHARGING ELECTRODE DRIVING SECTION
(b) → LIGHT EMITTING LAYER EMITTING SECTION
(c) → ACTIVE LAYER CHARGING SECTION
(d) → SWITCHING ELEMENT TURNING-ON SECTION
(e) → STORAGE UNIT STORING SECTION

ORGANIC LIGHT EMITTING DISPLAY APPARATUS

BACKGROUND

1. Field

Embodiments relate to an organic light emitting display apparatus.

2. Description of the Related Art

Recently, research into realizing low power consumption has been conducted in a display field. Regarding low power consumption, research into, e.g., grafting a solar cell technology onto a display technology or using a light generated by a display has been conducted.

SUMMARY

Embodiments are directed to an organic light emitting display apparatus.

The embodiments may be realized by providing an organic light emitting display apparatus including a substrate; a lower active layer on the substrate, the lower active layer including an oxide semiconductor configured to generate current in response to light; an etching prevention layer on an upper portion of the lower active layer, the etching prevention layer including a contact hole; a source or drain electrode on the etching prevention layer, the source or drain electrode being electrically connected to the lower active layer through the contact hole; an upper charging electrode on the etching prevention layer, the upper charging layer overlapping the lower active layer; a light emitting layer contacting the upper charging electrode, the light emitting layer being configured to generate light; and a cathode electrode facing the upper charging electrode with the light emitting layer therebetween, the cathode electrode being configured to drive the light emitting layer in conjunction with the upper charging electrode, wherein the light emitting layer is configured to be driven and emit light in response to a driving voltage applied to the upper charging electrode, and the lower active layer is configured to store current generated in the oxide semiconductor in response to the driving voltage applied to the upper charging electrode.

The apparatus may further include a planarization layer on the etching prevention layer and the source or drain electrode, wherein the upper charging electrode is on the planarization layer and includes a region overlapping the lower active layer.

The apparatus may further include a pixel definition layer on the upper charging electrode, the pixel defining layer including an opening through which a part of the upper charging electrode is exposed.

The lower active layer may be configured to generate current in response to light from the light emitting layer and externally incident light.

The oxide semiconductor may include at least one of In, Ga, and Zn.

An area of the lower active layer may be greater than an area of the light emitting layer.

The upper charging electrode may include ITO.

The apparatus may further include a switching element, the switching element having one end electrically connected to the source or drain electrode; and a storage unit connected to another end of the switching element, the storage unit being configured to receive and store current stored in the lower active layer in response to a switching condition of the switching element.

The embodiments may also be realized by providing an organic light emitting display apparatus including a substrate; a lower charging electrode surrounding an edge of the substrate; a planarization layer on the lower charging electrode; an upper active layer on the planarization layer, the upper active layer overlapping the lower charging electrode and including an oxide semiconductor configured to generate current in response to light; a source or drain electrode on the upper active layer; an anode electrode on a same layer as the upper active layer, the anode electrode being spaced apart from the upper active layer and corresponding to a center portion of the substrate; a light emitting layer on the anode electrode, the light emitting layer being configured to generate light; and a cathode electrode facing the anode electrode with the light emitting layer therebetween, the cathode electrode being configured to drive the light emitting layer in conjunction with the anode electrode, wherein the light emitting layer is configured to be driven and emit light in response to a charging voltage applied to the lower charging electrode, and the upper active layer is configured to store current generated in the oxide semiconductor in response to the charging voltage applied to the lower charging electrode.

The lower charging electrode may surround the edge of the substrate and may form a closed-loop, the upper active layer may surround the edge of the substrate, may form a closed-loop, and may overlap the charging electrode with the planarization layer therebetween, and the source or drain electrode may be on the upper active layer and may form a closed-loop.

The lower charging electrode may surround the edge of the substrate and may include a first charging electrode and a second charging electrode, the upper active layer may surround the edge of the substrate and may include a first active layer overlapping the first charging electrode and a second active layer overlapping the second charging electrode with the planarization layer therebetween, the first active layer and the second active layer being spaced apart from each other, and the source or drain electrode may include a first source electrode or a first drain electrode on the first active layer, and a second source electrode or a second drain electrode on the second active layer, the first drain electrode or the second drain electrode or the first source electrode or the second source electrode being connected to each other.

The apparatus may further include a pixel definition layer on the source or drain electrode and the upper active layer, the pixel definition layer including an opening through which the anode electrode is exposed.

The upper active layer may be configured to generate current in response to light from the light emitting layer and externally incident light.

The oxide semiconductor may include at least one of In, Ga, and Zn.

An area of the upper active layer may be greater than an area of the light emitting layer.

The lower charging electrode may include a metal including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

The apparatus may further include a switching element having one end electrically connected to the source or drain electrode; and a storage unit connected to another end of the switching element, the storage unit being configured to receive and store current stored in the lower active layer in response to a switching condition of the switching element.

The embodiments may also be realized by providing an organic light emitting display apparatus including a substrate; a lower active layer on the substrate, the lower active layer including an oxide semiconductor configured to generate current in response to light; an etching prevention layer on an upper portion of the lower active layer, the etching prevention layer including a contact hole; a lower charging electrode on the etching prevention layer, the lower charging electrode being electrically connected to the lower active layer through the contact hole; a planarization layer on the lower charging electrode; an upper active layer on the planarization layer, the upper active layer overlapping with the lower charging electrode and including an oxide semiconductor configured to generate current in response to light; a source or drain electrode on the upper active layer; an upper charging electrode on the planarization layer, the upper charging electrode overlapping the lower active layer; a light emitting layer contacting the upper charging electrode, the light emitting layer being configured to generate light; and a cathode electrode facing the upper charging electrode with the light emitting layer therebetween, the cathode electrode being configured to drive the light emitting layer in conjunction with the upper charging electrode, wherein the light emitting layer is configured to be driven and emit light in response to a driving voltage applied to the upper charging electrode, the lower active layer is configured to store current in the oxide semiconductor in response to the driving voltage applied to the upper charging electrode, the upper active layer is configured to store current generated in the oxide semiconductor in response to a charging voltage applied to the lower charging electrode, the charging voltage applied to the lower charging electrode being the same as the driving voltage applied to the upper charging electrode.

The lower active layer and the upper active layer may be configured to generate current in response to light from the light emitting layer and externally incident light.

The oxide semiconductor may include at least one of In, Ga, and Zn.

An area of the lower active layer may be greater than an area of the light emitting layer.

The upper charging electrode may include ITO.

The apparatus may further include a switching element having one end electrically connected to the lower charging electrode and the source or drain electrode; and a storage unit connected to another end of the switching element, the storage unit being configured to receive current stored in the lower active layer in response to a switching condition of the switching element.

BRIEF DESCRIPTION OF THE DRAWINGS

Features and advantages will become more apparent to those of ordinary skill in the art by describing in detail exemplary embodiments with reference to the attached drawings, in which.

DETAILED DESCRIPTION

Korean Patent Application No. 10-2010-0087033, filed on Sep. 6, 2010, in the Korean Intellectual Property Office, and entitled: "Organic Light Emitting Display Apparatus," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout. As used herein, the terms "and," "or," and "and/or" include any and all combinations of one or more of the associated listed items.

While such terms as "first," "second," etc., may be used to describe various components, such components must not be limited to the above terms. The above terms are used only to distinguish one component from another.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Figure 1:
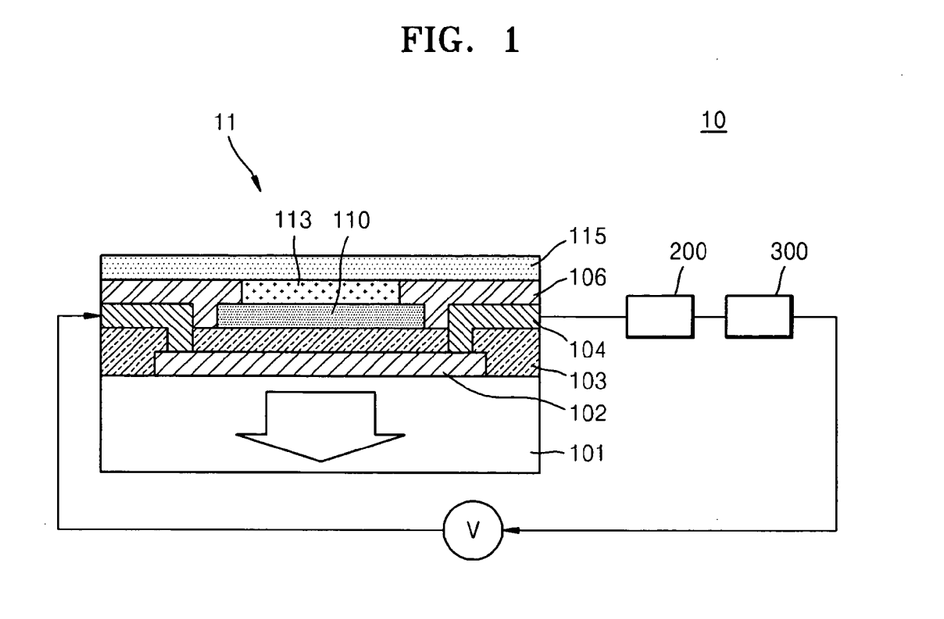
FIG. 1 illustrates a cross-sectional view of an organic light emitting display apparatus according to an embodiment.

FIG. 1 illustrates a cross-sectional view of an organic light emitting display apparatus according to an embodiment. Referring to FIG. 1, the organic light emitting display apparatus 10 may include an organic light emitting diode as a part of a light charging element 11, portions of the light charging element 11 may directly receive light from the organic light emitting diode and may charge or store current generated in response to the light, a switching element 200, and a storage unit 300 connected to the light charging element 11. The light charging element 11 of the organic light emitting display apparatus 10 of the present embodiment may include a driving transistor that drives the organic light emitting diode.

For example, the light charging element 11 may include a substrate 101, a lower active layer 102 on the substrate 101 and including an oxide semiconductor, an etching prevention layer 103 on an upper portion of the lower active layer 102 and including a contact hole, a source and/or a drain electrode 104 on the etching prevention layer 103 and being electrically connected to the lower active layer 102 through the contact hole, an upper charging electrode 110 on the etching prevention layer 103 and overlapping with or overlying the lower active layer 102, a pixel definition layer 106 on the upper charging electrode 110 and including an opening through which a part of the upper charging electrode 110 is exposed, a light emitting layer 113 contacting the upper charging electrode 110 and being configured to generate light, and a cathode electrode 115 facing the upper charging electrode 110 with the light emitting layer 113 therebetween.

The substrate 101 may be formed of a transparent material to realize a bottom emission.

The lower active layer 102 may be disposed on the substrate 101 and may include the oxide semiconductor. The oxide semiconductor may include at least one of In, Ga, and Zn. For example, the Ga, In, and Zn of the oxide semiconductor may all be included at an atom % ratio of about 2:2:1. However, the embodiments are not limited thereto; and the oxide semiconductor may include at least one of InGaZnO, $SnO_2$, $In_2O_3$, ZnO, CdO, $Cd_2SnO_4$, $TiO_2$, and $Ti_3N_4$. The lower active layer 102 may generate current in response to light generated by the light emitting layer 113 that is incident on the oxide semiconductor. However, the embodiments are not limited thereto; and the lower active layer 102 may also generate current in response to externally incident light.

A thickness of the lower active layer 102 may be less than about 50 nm. When the oxide semiconductor is on the substrate 101 and serves as the lower active layer 102, the oxide semiconductor may be formed by using various deposition methods, e.g., a plasma enhanced chemical vapor deposition (PECVD) method, an atmosphere pressure CVD (APCVD) method, a low pressure CVD (LPCVD) method, etc. In an implementation, a partial pressure of oxygen may be about 5% to about 90% as a deposition condition. In another implementation, the partial pressure of oxygen may be about 10% to about 70%.

An area of the lower active layer 102 may be greater than an area of the light emitting layer 113. As described above, the lower active layer 102 may generate the current in response to the light generated by the light emitting layer 113. Maintaining the area of the lower active layer 102 greater than the area of the light emitting layer 113 may help ensure sufficient current generating efficiency. In an implementation, maintaining the area of the lower active layer 102 greater than the area of the light emitting layer 113 may help ensure higher efficiency of converting the externally incident light on the lower active layer 102 into current, e.g., generating current in response to the external light incident thereon.

The etching prevention layer 103 may include an insulation material and may be on the lower active layer 102. The contact hole may be formed in the etching prevention layer 103 such that the source electrode and/or drain electrode 104 and the lower active layer 102 may electrically contact each other.

The source electrode and/or drain electrode 104 may include a metal including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The source electrode and/or drain electrode 104 may be formed on the etching prevention layer 103. The source electrode and/or drain electrode 104 may electrically contact the lower active layer 102 through the contact hole of the etching prevention layer 103.

The upper charging electrode 110 may include, e.g., ITO. The upper charging electrode 110 may be formed on the etching prevention layer 103. The upper charging electrode 110 may correspond to the lower active layer 102, may be formed on the lower active layer 102, and may overlap the lower active layer 102. In the present embodiment, the upper charging electrode 110 may function as an anode electrode end that supplies a driving voltage used to drive the light emitting layer 113. Simultaneously, the upper charging electrode 110 may form an electric field by using the driving voltage and thus may function as a charging electrode that facilitates charging or storing of current generated in the oxide semiconductor of the lower active layer 102 in the lower active layer 102. Although not shown, the upper charging electrode 110 may function as the anode electrode end. Thus, the upper charging electrode 110 may be electrically connected to the source electrode and/or drain electrode 104. Accordingly, the driving voltage may be transmitted from outside of the light charging element 11 through the source electrode and/or drain electrode 104 and may be applied to the upper charging electrode 110. The driving operation of the upper charging electrode 110 will be described in detail below.

The pixel definition layer 106 may be disposed on the upper charging electrode 110 and may include the opening through which a part of the upper charging electrode 110 is exposed.

The light emitting layer 113 may contact the upper charging electrode 110 exposed through the opening of the pixel definition layer 106. For example, the light emitting layer 113 may be formed on the upper charging electrode 110. The light emitting layer 113 may be driven by the upper charging electrode 110 and the cathode electrode 115 to generate light. The light emitting layer 113 may include an organic material. In an implementation, the light emitting layer 113 may further include, e.g., a hole injection layer (HIL), a hole transport layer (HTL), an electron transport layer (ETL), an electron injection layer (EIL), etc.

The cathode electrode 115 may face the upper charging electrode 110 with the light emitting layer 113 therebetween. The cathode electrode 115 and the upper charging electrode 110 may drive the light emitting layer 113.

Although not shown, a sealing member may be formed on the cathode electrode 115 to protect the light emitting layer 113 and other layers from, e.g., external moisture or oxygen.

The switching element 200 may be a transistor and may have one end connected to the source electrode and/or drain electrode 104 of the light charging element 11 and another end connected to the storage unit 300. When the switching element 200 is turned on, current stored in the lower active layer 102 of the light charging element 11 may be discharged from the source electrode and/or drain electrode 104 and may be stored in the storage unit 300.

The storage unit 300 may be realized as a capacity element, e.g., a capacitor.

A method of driving the organic light emitting display apparatus 10 of the present embodiment will now be described in detail. As described above, the upper charging electrode 110 may function as the anode electrode end. Thus, a driving voltage used to drive the light emitting layer 113 may be applied to the upper charging electrode 110. For example, a + voltage may be applied to the upper charging electrode 110. Simultaneously, a − voltage used to drive the light emitting layer 113 may be applied to the cathode electrode 115. If the driving voltage is applied to the upper charging electrode 110, the light emitting layer 113 may generate light. A top emission may be performed in the present embodiment. However, light generated by the light emitting layer 113 may also be injected into or irradiated onto the lower active layer 102 below the light emitting layer 113. Although not shown, external light, e.g., solar light, may be injected into or irradiated onto the lower active layer 102.

The lower active layer 102 may generate current in response to light incident thereon. For example, the lower active layer 102 may absorb light through a band structure of the oxide semiconductor in the lower active layer 102 and may generate electrons corresponding to the light. In this regard, the driving voltage applied to the upper charging electrode 110 may be used to well bend the band structure of the oxide semiconductor in such a way that the oxide semiconductor generates a greater amount of electrons. In the present embodiment, the lower active layer 102 may simultaneously generate current and charge or store the generated current. For example, the + voltage applied to the upper charging electrode 110 used to drive the light emitting layer 113 may form an electric field; and the electric field of the upper charging electrode 110 may hold the electrons generated by the lower active layer 102 to interfaces of the lower active layer 102 and the etching prevention layer 103 in order to prevent the electrons from being discharged through the source electrode and/or drain electrode 104.

The charged or stored current may be discharged when the switching element 200 electrically connected to the source electrode and/or drain electrode 104 is turned on and thus may be stored in the storage unit 300.

Figure 2:
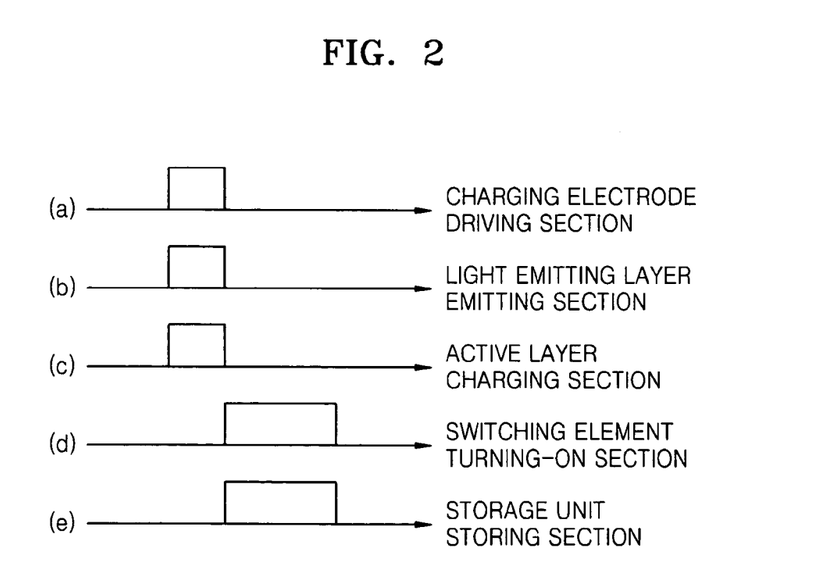
FIG. 2 illustrates timing diagrams of an operation of the organic light emitting display apparatus of FIG. 1.

FIG. 2 illustrates timing diagrams of an operation of the organic light emitting display apparatus 10. For example, FIG. 2 (a)-(e) illustrate sections in which a driving voltage is applied to the upper charging electrode 110, the light emitting layer 113 emits a light, current is charged or stored in the lower active layer 102, the switching element 200 is turned on, and the current is stored in the storage unit 300, respectively.

Referring to FIG. 2, in (a) to (c), the driving voltage may be applied to the upper charging electrode 110 and simultaneously the light emitting layer 113 may emit light. The light emitting layer 113 may emit light and simultaneously the lower active layer 102 may generate current. The lower active layer 102 may generate current and simultaneously the current generated by the lower active layer 102 may be charged or stored in the lower active layer 102 by using the driving voltage applied to the upper charging electrode 110. Referring to (d) and (e) of FIG. 2, the current charged or stored in the lower active layer 102 may be discharged and may be stored in the storage unit 300 in a section in which the switching element 200 is turned on.

Figure 3:
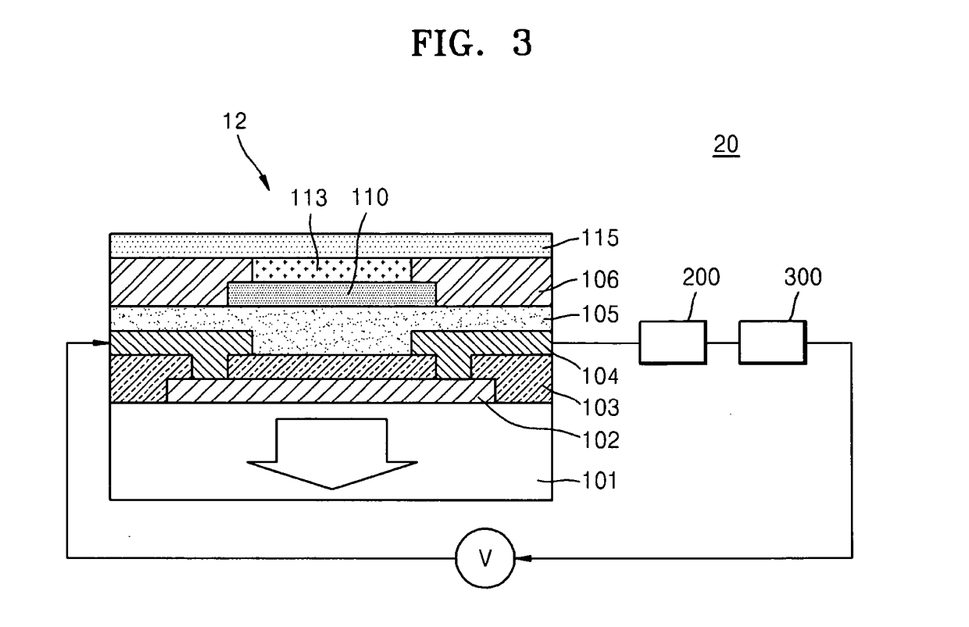
FIG. 3 illustrates a schematic cross-sectional view of an organic light emitting display apparatus according to another embodiment.

FIG. 3 illustrates a schematic cross-sectional view of an organic light emitting display apparatus according to another embodiment. The organic light emitting display apparatus 20 of the present embodiment may further include a planarization layer 105 on the etching prevention layer 103 and the source electrode and/or drain electrode 104, e.g., a different structure from that of the organic light emitting display apparatus 10 of FIG. 1. Functions of other elements of the organic light emitting display apparatus 20 of the present embodiment are the same as those of the elements of the organic light emitting display apparatus 10 of the previous embodiment. Thus, a repeated detailed description thereof is omitted. A method of driving the organic light emitting display apparatus 20 and an operation thereof are the same as those of the previous embodiment. Thus, a repeated descriptions thereof is also omitted. Reference numeral 12 denotes a light charging element of the present embodiment.

Referring to FIG. 3, the planarization layer 105 may be formed of an insulation material and may planarize and insulate between the upper charging electrode 110 and the lower active layer 102. In this regard, the upper charging electrode 110 may be formed on the planarization layer 105 and may overlap with the lower active layer 102. In the organic light emitting display apparatus 10 of the previous embodiment illustrated FIG. 1, although the planarization layer 105 is not present, the etching prevention layer 103 may serve planarizing and insulating functions between the upper charging electrode 110 and the lower active layer 102.

Figure 4:
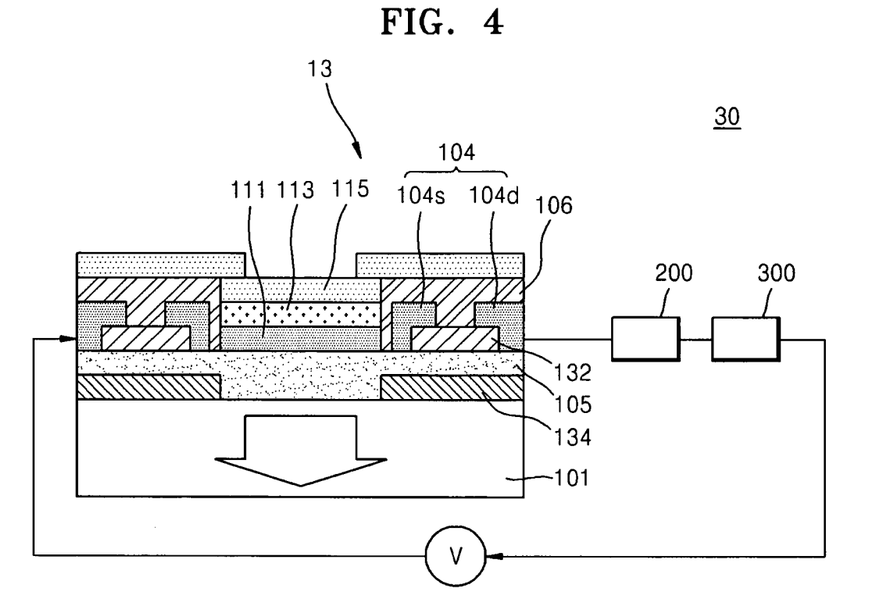
FIG. 4 illustrates a schematic cross-sectional view of an organic light emitting display apparatus according to yet another embodiment.
Figure 5:
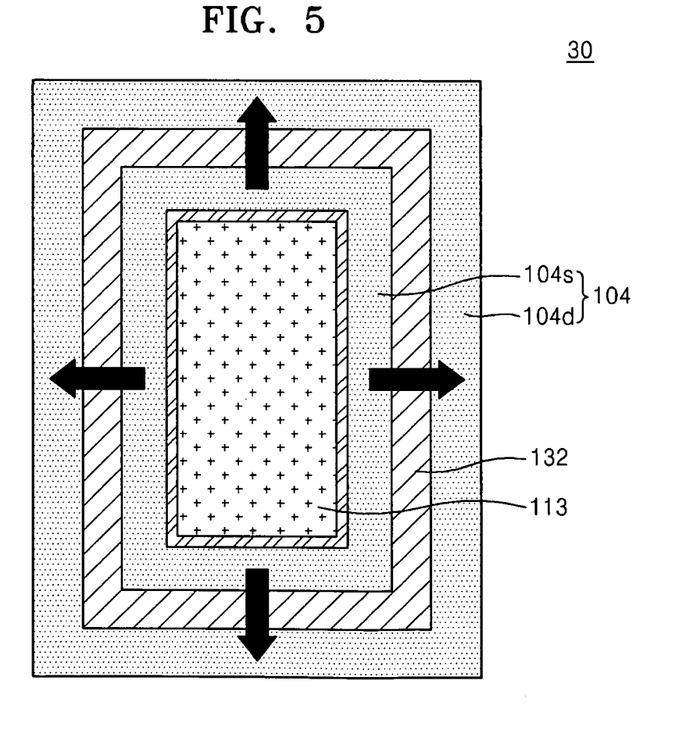
FIG. 5 illustrates a top plan view of the organic light emitting display apparatus of FIG. 4.

FIG. 4 illustrates a schematic cross-sectional view of an organic light emitting display apparatus according to yet another embodiment. FIG. 5 illustrates a top plan view of the organic light emitting display apparatus of FIG. 4.

Referring to FIGS. 4 and 5, the organic light emitting display apparatus 30 of the present embodiment may include an organic light emitting diode, a light charging element 13 that indirectly receives light from the organic light emitting diode and charges or stores current generated in response to the light, and the switching element 200 and storage unit 300 that are connected to the light charging element 13. The organic light emitting display apparatus 30 of the present embodiment includes the light charging element 13, separately from a driving transistor that drives the organic light emitting diode.

For example, the light charging element 13 may include the substrate 101, a lower charging electrode 134 surrounding an edge of the substrate 101, the planarization layer 105 on the lower charging electrode 134, an upper active layer 132 on the planarization layer 105, overlapping with the lower charging electrode 134, and including an oxide semiconductor that generates current in response to light incident thereon, the source electrode and/or drain electrode 104 on the planarization layer 132, the pixel definition layer 106 on the source electrode and/or drain electrode 104, a source electrode 104s, and a drain electrode 104d, and including an opening through which an anode electrode 111 is exposed, the anode electrode 111 being spaced apart from the upper active layer 132, corresponding to a center portion of the substrate 101, and driving the light emitting layer 113, the light emitting layer 113 on the anode electrode 111 and being configured to generate light, and the cathode electrode 115 facing the anode electrode 111 with the light emitting layer 113 therebetween and driving the light emitting layer 113 in conjunction with the anode electrode 111.

The substrate 101 may be formed of a transparent material to realize a bottom emission.

As described above, the lower charging electrode 134 may surround the edge of the substrate 101. For example, referring to FIG. 5, the lower charging electrode 134 may surround the edge of the substrate 101 and may form a closed-loop. The lower charging electrode 134 may include a metal including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

The lower charging electrode 134 may form an electric field by using a charging voltage applied from outside the light charging element 13 and may facilitate storage of current generated in the oxide semiconductor of the upper active layer 132 in the upper active layer 132. The charging voltage may be applied when the light emitting layer 113 is driven. For example, the charging voltage may be the same as a driving voltage applied to the cathode electrode 115 to drive the light emitting layer 113. The driving operation of the lower charging electrode 134 will be described in detail below.

The planarization layer 105 may be formed on the lower charging electrode 134 and may be formed of an insulation material. The planarization layer 105 may planarize and insulate between the lower charging electrode 134 and the upper active layer 132.

The upper active layer 132 may be formed on the planarization layer 105, may correspond to the lower charging electrode 134, and may overlap with the lower charging electrode 134. Referring to FIG. 5, the upper active layer 132 may surround the edge of the substrate 101, may overlap the lower charging electrode 132 with the planarization layer 105 therebetween, and may form a closed-loop.

The upper active layer 132 may include the oxide semiconductor that generates current in response to light incident thereon. The oxide semiconductor may include at least one of In, Ga, and Zn. For example, the Ga, In, and Zn may all be included in the oxide semiconductor in an atom % ratio of about 2:2:1. However, the embodiments are not limited thereto; and the oxide semiconductor may include at least one of InGaZnO, $SnO_2$, $In_2O_3$, ZnO, CdO, $Cd_2SnO_4$, $TiO_2$, and $Ti_3N_4$. The upper active layer 132 may generate current in response to light generated by the light emitting layer 113 incident on the oxide semiconductor. However, the embodiments are not limited thereto; and the upper active layer 132 may also generate current from externally incident light.

An area of the upper active layer 132 may be greater than an area of the light emitting layer 113. As described above, the upper active layer 132 may generate current in response to light generated by the light emitting layer 113. Thus, maintaining the area of the upper active layer 132 greater than the area of the light emitting layer 113 may help ensure sufficient current generating efficiency. In addition, the greater the area of the upper active layer 132, the higher the efficiency of the conversion of the externally incident light on the upper active layer 132.

In the apparatus illustrated in FIG. 1, the efficiency of externally discharged light may deteriorate due to absorption and reflection of light generated in the light emitting layer 113 when the light is transmitted to the lower active layer 102. However, in the present embodiment, as illustrated in FIG. 4, the upper active layer 132 may surround the light emitting layer 113 so that light generated in the light emitting layer 113 is not blocked by the upper active layer, but rather may be directly discharged outside, thereby maintaining light efficiency. As a result, in the present embodiment, light that is generated in the light emitting layer 113 and is reflected or transferred to the organic light emitting display apparatus 30 may be used to generate current in the upper active layer 132.

The source electrode 104s and the drain electrode and 104d may include, e.g., ITO, and may be formed on the upper active layer 132. The source electrode and the drain electrode 104s and 104d may form a closed-loop on the upper active layer 132.

The pixel definition layer 106 may be formed on the source electrode 104s, the drain electrode 104d, and the upper active layer 132, and may include the opening through which the anode electrode 111 is exposed.

The anode electrode 111 may be on a same layer as, e.g., may be coplanar with, the upper active layer 132. The anode electrode 111 may be spaced apart from the upper active layer 132 and may correspond to a center portion of the substrate 101. The anode electrode 111 may receive the driving voltage and may drive the light emitting layer 113 in conjunction with the cathode electrode 115. Although not shown, the anode electrode 111 may be electrically connected to a source end or a drain end of a driving transistor (not shown). Thus, the driving voltage may be applied to the anode electrode 111 through the source end or the drain end of the driving transistor (not shown).

The light emitting layer 113 may be formed on the anode electrode 111. The light emitting layer 113 may generate light in response to driving by anode electrode 111 and the cathode electrode 115. The light emitting layer 113 may include an organic material. In an implementation, the light emitting layer 113 may further include, e.g., a HIL, a HTL, an ETL, an EIL, etc.

The cathode electrode 115 may face the anode electrode 111 with the light emitting layer 113 therebetween. The cathode electrode 115 and the anode electrode 111 may drive the light emitting layer 113. For example, a − voltage may be applied to the cathode electrode 115 as the driving voltage.

Although not shown, a sealing member may be formed on the cathode electrode 115 to protect the light emitting layer 113 and other layers from, e.g., external moisture or oxygen.

The switching element 200 may be a transistor and may have one end connected to the source electrode and/or drain electrode 104 of the light charging element 13 and another end connected to the storage unit 300. When the switching element 200 is turned on, current stored in the upper active layer 132 of the light charging element 13 may be discharged through the source electrode and/or drain electrode 104 and may be stored in the storage unit 300.

The storage unit 300 may be realized as a capacity element, e.g., a capacitor.

A method of driving the organic light emitting display apparatus 30 of the present embodiment will now be described in detail. A driving voltage used to drive the light emitting layer 113 may be applied to the anode electrode 111. For example, a + voltage may be applied to the anode electrode 111. Simultaneously, a − voltage used to drive the light emitting layer 113 may be applied to the cathode electrode 115. If the driving voltage is applied to the anode electrode 111, the light emitting layer 113 may generate light. The light generated in the light emitting layer 113 may spread into the organic light emitting display apparatus 30. Thus, the light may be injected into or incident onto the upper active layer 132. Simultaneously, a charging voltage may be applied to the lower charging electrode 134. The charging voltage may be applied from outside the light charging element 13, and e.g., may be the − voltage that is the same as the driving voltage applied to the cathode electrode 115.

The upper active layer 132 may generate current in response to the light incident thereon. For example, the upper active layer 132 may absorb light through a band structure of the oxide semiconductor in the upper active layer 132 and may generate electrons corresponding to the light. In this regard, the lower charging electrode 134, to which the charging voltage is applied, may be used to well bend the band structure of the oxide semiconductor in such a way that the oxide semiconductor generates a greater amount of electrons. In the present embodiment, the upper active layer 132 may simultaneously generate current and charge or store the generated current. For example, the − voltage applied to the lower charging electrode 134 may form an electric field; and the electric field of the lower charging electrode 134 may hold the electrons generated by the upper active layer 132 to interfaces of the upper active layer 132 and the planarization layer 105 in order to prevent the electrons from being discharged through the source electrode and/or drain electrode 104. Thus, the lower charging electrode 134 may charge or store the current in the upper active layer 132.

The charged or stored current may be discharged when the switching element 200 electrically connected to the source electrode and/or drain electrode 104 is turned on and thus may be stored in the storage unit 300.

The driving timing diagrams of the organic light emitting display apparatus 30 of the present embodiment are the same as those of the organic light emitting display apparatus 10 illustrated in FIG. 2. Thus, a repeated description thereof is omitted.

Figure 6:
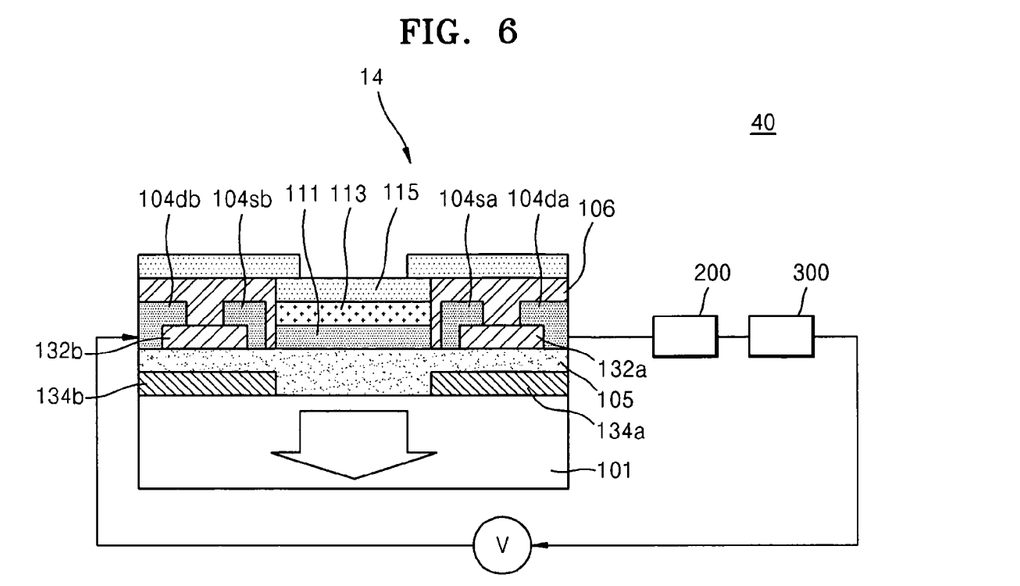
FIG. 6 illustrates a schematic cross-sectional view of an organic light emitting display apparatus according to still another embodiment.
Figure 7:
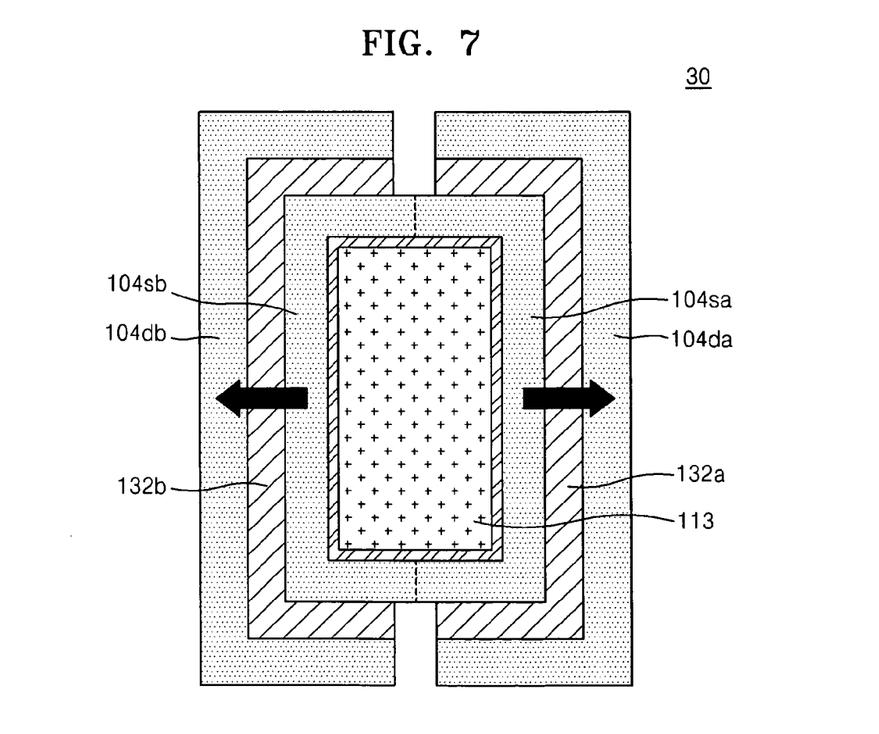
FIG. 7 illustrates a top plan view of the organic light emitting display apparatus of FIG. 6.

FIG. 6 illustrates a schematic cross-sectional view of an organic light emitting display apparatus according to still another embodiment. FIG. 7 illustrates a top plan view of the organic light emitting display apparatus of FIG. 6.

The organic light emitting display apparatus 40 of the present embodiment is different from the organic light emitting display apparatus of the previous embodiment in terms of structures of the upper active layer 132, the source electrode 104s, and the drain electrode 104d. Other elements of the organic light emitting display apparatus 40 and functions thereof are the same as those of the organic light emitting display apparatus of the previous embodiment. Thus, repeated descriptions thereof are omitted. A method of driving the organic light emitting display apparatus 40 of the present embodiment and timing operations thereof are the same as the organic light emitting display apparatus of the previous embodiment. Thus, repeated descriptions thereof are omitted.

Referring to FIGS. 6 and 7, the organic light emitting display apparatus 40 of the present embodiment may include a first charging electrode 134a and a second charging electrode 134b that surround an edge of the substrate 101 and are electrically connected to each other. For example, the first charging electrode 134a and the second charging electrode 134b may be electrically connected in series to each other. The serial connection between the first charging electrode 134a and the second charging electrode 134b may increase a voltage output to the storage unit 300. A reference numeral 14 denotes a light charging element of the present embodiment.

Referring to FIG. 7, the organic light emitting display apparatus 40 of the present embodiment may include a first active layer 132a and a second active layer 132b that are spaced apart from each other. The first active layer 132a may surround the edge of the substrate 101 and may overlap the first charging electrode 134a with the planarization layer 105 therebetween. The second active layer 132b may surround the edge of the substrate 101 and may overlap the second charging electrode 134b with the planarization layer 105 therebetween.

A first source electrode 104sa and a first drain electrode 104da may be formed on the first active layer 132a. In the same manner, a second source electrode 104sb and a second drain electrode 104db may be formed on the second active layer 132b. The first source electrode 104sa and the second source electrode 104sb may be connected to each other. However, the embodiments are not limited thereto; and first drain electrode 104da and the second drain electrode 104db may be connected to each other, instead of the connection between the first source electrode 104sa and the second source electrode 104sb.

Figure 8:
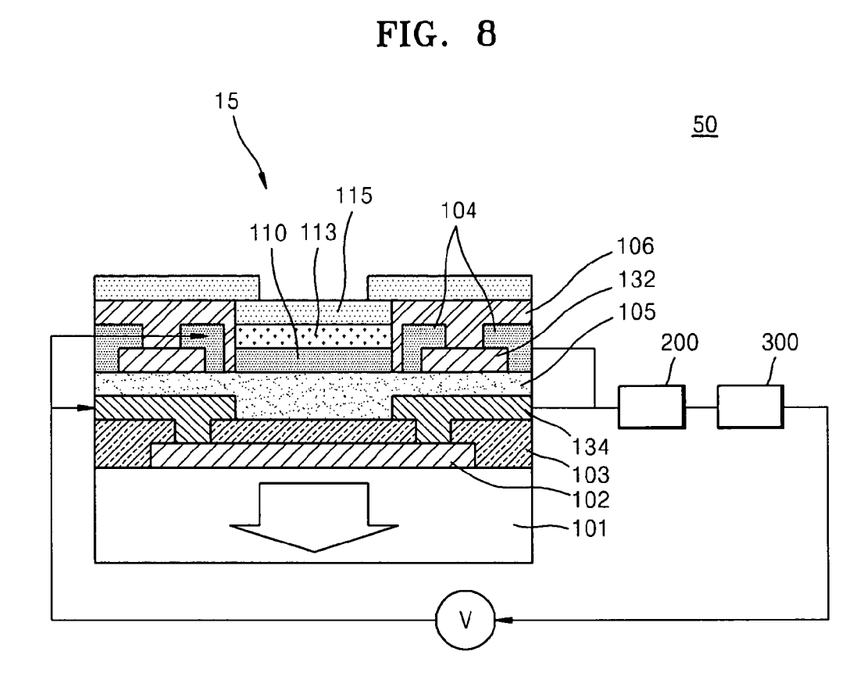
FIG. 8 illustrates a schematic cross-sectional view of an organic light emitting display apparatus according to still another embodiment.

FIG. 8 illustrates a schematic cross-sectional view of an organic light emitting display apparatus according to still another embodiment. The organic light emitting display apparatus 50 of the present embodiment includes a combination of features of the embodiment illustrated in FIG. 3 and the embodiment illustrated in FIG. 4. Thus, elements of the organic light emitting display apparatus 50 are the same as those of the organic light emitting display apparatuses 30 and 40 and a repeated description thereof is omitted. A method of driving the organic light emitting display apparatus 50 of the present embodiment and timing operations thereof are the same as the organic light emitting display apparatuses 30 and 40, and thus repeated descriptions thereof are omitted.

The organic light emitting display apparatus 50 of the present embodiment may achieve maximum light charging because the organic light emitting display apparatus 50 may include the lower active layer 102 of the embodiment illustrated in FIG. 3 that directly receives the light generated in the light emitting layer 113 and generates current as well as the upper active layer 132 of the embodiment illustrated in FIG. 4 that receives light generated in the light emitting layer 113 and is reflected and transferred to the organic light emitting display apparatus 50 to thereby generate current.

Referring to FIG. 8, a light charging element 15 of the organic light emitting display apparatus 50 of the present embodiment may include the substrate 101, a lower active layer 102 on the substrate 101 and including an oxide semiconductor that generates current in response to light incident thereon, the etching prevention layer 103 on an upper portion of the lower active layer 102 and including a contact hole, the lower charging electrode 134 on the etching prevention layer 103 and electrically connected to the lower active layer 102 through the contact hole, the planarization layer 105 on the lower charging electrode 134, the upper active layer 132 on the planarization layer 105, overlapping with the lower charging electrode 134, and including an oxide semiconductor that generates current in response to light, the source electrode and/or drain electrode 104 on the upper active layer 132, the upper charging electrode 110 on the planarization layer 105 and overlapping with the lower active layer 102, the light emitting layer 113 contacting the upper charging electrode 110 and being configured to generate light, and the cathode electrode 115 facing the upper charging electrode 110 with the light emitting layer 113 therebetween and driving the light emitting layer 113 in conjunction with the upper charging electrode 110.

The lower active layer 102 and the upper active layer 132 may generate current in response to light generated in the light emitting layer 113, but is not limited thereto. In an implementation, the lower active layer 102 and the upper active layer 132 may also generate current in response to externally incident light. The lower active layer 102 and the upper active layer 132 may include an oxide semiconductor including at least one of In, Ga, and Zn. In an implementation, an area of the lower active layer 102 may be greater than an area of the light emitting layer 113. The upper charging electrode 110 may include, e.g., ITO. The lower charging electrode 134 may include a metal including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

The switching element 200 may be a transistor and may have one end connected to the source electrode and/or drain electrode 104 of the light charging element 15 and the lower charging electrode 134 and another end connected to the storage unit 300. When the switching element 200 is turned on, current stored in the upper active layer 132 and the lower active layer 102 of the light charging element 13 may be discharged through the source electrode and/or drain electrode 104 and may be stored in the storage unit 300.

A method of driving the organic light emitting display apparatus 50 of the present embodiment will now be described.

The upper charging electrode 110 may function as an anode electrode. Thus, a driving voltage used to drive the light emitting layer 113 may be applied thereto. For example, a + voltage may be applied to the upper charging electrode 110. Simultaneously, a − voltage used to drive the light emitting layer 113 may be applied to the cathode electrode 115. If the driving voltage is applied to the upper charging electrode 110, the light emitting layer 113 may generate light. The light generated in the light emitting layer 113 may be injected into or incident onto the lower active layer 102 below the light emitting layer 113. Although not shown, external light, e.g., solar light, may also be incident onto the lower active layer 102.

The lower active layer 102 may generate current in response to the light incident thereon. For example, the lower active layer 102 may absorb light through a band structure of the oxide semiconductor in the lower active layer 102 and may generate electrons corresponding to the light. In this regard, the driving voltage applied to the upper charging electrode 110 may be used to well bend the band structure of the oxide semiconductor in such a way that the oxide semiconductor generates a greater amount of electrons. In the present embodiment, the lower active layer 102 may simultaneously generate current and charge or store the generated current. For example, the + voltage applied to the upper charging electrode 110 used to drive the light emitting layer 113 may form an electric field; and the electric field of the upper charging electrode 110 may hold the electrons generated by the lower active layer 102 to interfaces of the lower active layer 102 and the etching prevention layer 103 in order to prevent the electrons from being discharged through the source electrode and/or drain electrode 104. Thus, the upper charging electrode 110 may charge or store the current in the lower active layer 102.

At the same time, the lower charging electrode 134 may facilitate charging or storing of the current in the upper active layer 132. For example, when the driving voltage is applied to the upper charging electrode 110, a charging voltage may be simultaneously charged in the lower charging electrode 134. The charging voltage may be applied from outside the light charging element 15 and, e.g., may be the −voltage that is the same as the driving voltage applied to the cathode electrode 115.

The driving voltage may be applied to the upper charging electrode 110 and may drive the light emitting layer 113 so that light is generated. The upper active layer 132 may generate current in response to light incident thereon. In this regard, the lower charging electrode 134 to which the − voltage is applied may be used to well bend the band structure of the oxide semiconductor in such a way that the oxide semiconductor generates a greater amount of electrons. Further, the − voltage applied to the lower charging electrode 134 may form an electric field; and the electric field of the lower charging electrode 134 may hold the electrons generated by the upper active layer 132 to interfaces of the upper active layer 132 and the planarization layer 105 in order to prevent the electrons from being discharged through the source electrode and/or drain electrode 104. Thus, the lower charging electrode 134 may facilitate charging or storing of the current in the upper active layer 132.

In the organic light emitting display apparatuses 10, 20, 30, 40, and 50 of the embodiments, an oxide semiconductor may be used to convert light emitted in an organic light emitting diode into an electric energy and store the energy, thereby realizing low power consumption of the organic light emitting display apparatuses 10, 20, 30, 40, and 50. Further, a light charging element may be formed without an additional mask, which is efficient and economical. A reference numeral V denotes a charging power.

An experiment result of the light charging efficiency of an oxide semiconductor will now be described. For the experiment, similarly to the light charging element 11 of the embodiment illustrated in FIG. 1, a light charging element was manufactured in a shape of a thin film transistor including an active layer and a charging electrode. The active layer included the oxide semiconductor having Ga, In, and Zn at an atom % ratio of 2:2:1.

In a direct incidence experiment, the light charging efficiency was evaluated by making light generated in an LED that generates a blue light directly incident onto the oxide semiconductor.

Figure 9:
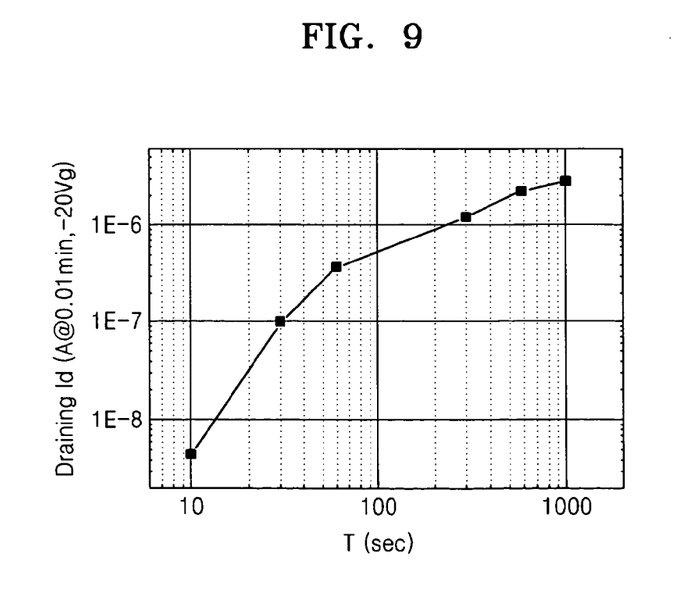
FIG. 9 illustrates a graph of an amount of a discharged current with respect to a charging time of an active layer when an external light is directly incident.

FIG. 9 illustrates a graph of an amount of a discharged current with respect to a charging time of an active layer when external light was directly incident thereon. Referring to FIG. 9, the amount of the discharged current of light charges increased according to the charging time of the active layer. A horizontal axis indicates the charging time. A vertical axis indicates the amount of the discharged current. Vg denotes a voltage of a charging electrode.

In an indirect incidence experiment using an internal light, an LED that generates blue light was spaced apart from a light charging element on a horizontal surface; and light generated from the LED was incident onto the oxide semiconductor.

Figure 10:
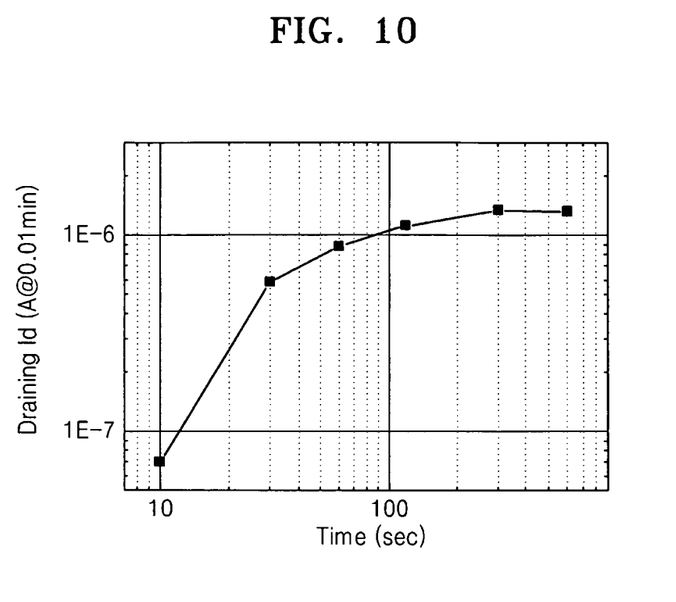
FIG. 10 illustrates a graph of an amount of a discharged current with respect to a charging time of an active layer when an internal light is indirectly incident.

FIG. 10 illustrates a graph of an amount of a discharged current with respect to a charging time of an active layer when internal light was indirectly incident. Referring to FIG. 10, the amount of the discharged current of light charges increased according to the charging time of the active layer, similarly to the results illustrated in FIG. 9.

Figure 11:
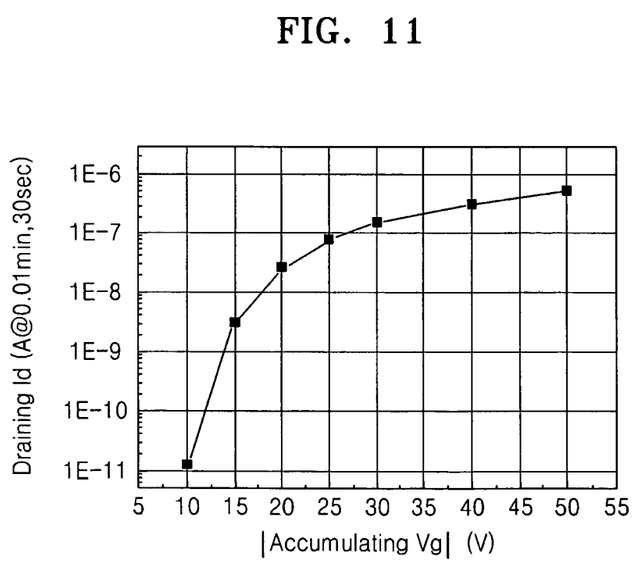
FIG. 11 illustrates a graph of an amount of a charged current with respect to a voltage intensity of a charging electrode.

FIG. 11 illustrates a graph of an amount of a charged current with respect to a voltage intensity of a charging electrode. Referring to FIG. 11, the greater a charging voltage was applied to the charging electrode, the more the light charges were charged. A horizontal axis indicates a charging intensity of the charging electrode. A vertical axis indicates the amount of the charged current.

By way of summation and review, an organic light emitting display includes an organic light emitting diode. Only about 20% of light emitted in the organic light emitting display may be expressed outside the organic light emitting display. For example, about 80% of the light emitted in the organic light emitting display is consumed therein. The embodiments described herein may realize low power consumption of the organic light emitting display by storing light consumed in the organic light emitting display and reutilizing the light.

As described above, according to the embodiments, an oxide semiconductor may be used to convert light emitted in an organic light emitting diode into electric energy and store the energy, thereby realizing low power consumption of an organic light emitting display apparatus.

Further, a light charging element may be formed without an additional mask, thereby ensuring efficiency and economy.

The embodiments provide an organic light emitting display apparatus capable of light charging.

For example, the embodiments provide an organic light emitting display apparatus capable of optical charging using an oxide semiconductor.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting display apparatus, comprising:
a substrate;
a lower active layer on the substrate, the lower active layer including an oxide semiconductor configured to generate current in response to light;
an etching prevention layer on an upper portion of the lower active layer, the etching prevention layer including a contact hole;
a source or drain electrode on the etching prevention layer, the source or drain electrode being electrically connected to the lower active layer through the contact hole;
an upper charging electrode on the etching prevention layer, the upper charging layer overlapping the lower active layer;
a light emitting layer contacting the upper charging electrode, the light emitting layer being configured to generate light; and
a cathode electrode facing the upper charging electrode with the light emitting layer therebetween, the cathode electrode being configured to drive the light emitting layer in conjunction with the upper charging electrode,
wherein:
the light emitting layer is configured to be driven and emit light in response to a driving voltage applied to the upper charging electrode, and
the lower active layer is configured to store current generated in the oxide semiconductor in response to the driving voltage applied to the upper charging electrode.

2. The apparatus as claimed in claim 1, further comprising a planarization layer on the etching prevention layer and the source or drain electrode, wherein the upper charging electrode is on the planarization layer and includes a region overlapping the lower active layer.

3. The apparatus as claimed in claim 1, further comprising a pixel definition layer on the upper charging electrode, the pixel defining layer including an opening through which a part of the upper charging electrode is exposed.

4. The apparatus as claimed in claim 1, wherein the lower active layer is configured to generate current in response to light from the light emitting layer and externally incident light.

5. The apparatus as claimed in claim 1, wherein the oxide semiconductor includes at least one of In, Ga, and Zn.

6. The apparatus as claimed in claim 1, wherein an area of the lower active layer is greater than an area of the light emitting layer.

7. The apparatus as claimed in claim 1, wherein the upper charging electrode includes ITO.

8. The apparatus as claimed in claim 1, further comprising:
a switching element, the switching element having one end electrically connected to the source or drain electrode; and
a storage unit connected to another end of the switching element, the storage unit being configured to receive and store current stored in the lower active layer in response to a switching condition of the switching element.

9. An organic light emitting display apparatus, comprising:
a substrate;
a lower charging electrode surrounding an edge of the substrate;
a planarization layer on the lower charging electrode;
an upper active layer on the planarization layer, the upper active layer overlapping the lower charging electrode and including an oxide semiconductor configured to generate current in response to light;
a source or drain electrode on the upper active layer;
an anode electrode on a same layer as the upper active layer, the anode electrode being spaced apart from the upper active layer and corresponding to a center portion of the substrate;
a light emitting layer on the anode electrode, the light emitting layer being configured to generate light; and
a cathode electrode facing the anode electrode with the light emitting layer therebetween, the cathode electrode being configured to drive the light emitting layer in conjunction with the anode electrode,
wherein:
the light emitting layer is configured to be driven and emit light in response to a charging voltage applied to the lower charging electrode, and
the upper active layer is configured to store current generated in the oxide semiconductor in response to the charging voltage applied to the lower charging electrode.

10. The apparatus as claimed in claim 9, wherein:
the lower charging electrode surrounds the edge of the substrate and forms a closed-loop,
the upper active layer surrounds the edge of the substrate, forms a closed-loop, and overlaps the charging electrode with the planarization layer therebetween, and
the source or drain electrode is on the upper active layer and forms a closed-loop.

11. The apparatus as claimed in claim 9, wherein:
the lower charging electrode surrounds the edge of the substrate and includes a first charging electrode and a second charging electrode,
the upper active layer surrounds the edge of the substrate and includes a first active layer overlapping the first charging electrode and a second active layer overlapping the second charging electrode with the planarization layer therebetween, the first active layer and the second active layer being spaced apart from each other, and
the source or drain electrode includes:
a first source electrode or a first drain electrode on the first active layer, and
a second source electrode or a second drain electrode on the second active layer, the first drain electrode or the second drain electrode or the first source electrode or the second source electrode being connected to each other.

12. The apparatus as claimed in claim 9, further comprising a pixel definition layer on the source or drain electrode and the upper active layer, the pixel definition layer including an opening through which the anode electrode is exposed.

13. The apparatus as claimed in claim 9, wherein the upper active layer is configured to generate current in response to light from the light emitting layer and externally incident light.

14. The apparatus as claimed in claim 9, wherein the oxide semiconductor includes at least one of In, Ga, and Zn.

15. The apparatus as claimed in claim 9, wherein an area of the upper active layer is greater than an area of the light emitting layer.

16. The apparatus as claimed in claim 9, wherein the lower charging electrode includes a metal including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

17. The apparatus as claimed in claim 9, further comprising:
   a switching element having one end electrically connected to the source or drain electrode; and
   a storage unit connected to another end of the switching element, the storage unit being configured to receive and store current stored in the lower active layer in response to a switching condition of the switching element.

18. An organic light emitting display apparatus, comprising:
   a substrate;
   a lower active layer on the substrate, the lower active layer including an oxide semiconductor configured to generate current in response to light;
   an etching prevention layer on an upper portion of the lower active layer, the etching prevention layer including a contact hole;
   a lower charging electrode on the etching prevention layer, the lower charging electrode being electrically connected to the lower active layer through the contact hole;
   a planarization layer on the lower charging electrode;
   an upper active layer on the planarization layer, the upper active layer overlapping with the lower charging electrode and including an oxide semiconductor configured to generate current in response to light;
   a source or drain electrode on the upper active layer;
   an upper charging electrode on the planarization layer, the upper charging electrode overlapping the lower active layer;
   a light emitting layer contacting the upper charging electrode, the light emitting layer being configured to generate light; and
   a cathode electrode facing the upper charging electrode with the light emitting layer therebetween, the cathode electrode being configured to drive the light emitting layer in conjunction with the upper charging electrode, wherein:
   the light emitting layer is configured to be driven and emit light in response to a driving voltage applied to the upper charging electrode,
   the lower active layer is configured to store current in the oxide semiconductor in response to the driving voltage applied to the upper charging electrode,
   the upper active layer is configured to store current generated in the oxide semiconductor in response to a charging voltage applied to the lower charging electrode, the charging voltage applied to the lower charging electrode being the same as the driving voltage applied to the upper charging electrode.

19. The apparatus as claimed in claim 18, wherein the lower active layer and the upper active layer are configured to generate current in response to light from the light emitting layer and externally incident light.

20. The apparatus as claimed in claim 18, wherein the oxide semiconductor includes at least one of In, Ga, and Zn.

21. The apparatus as claimed in claim 18, wherein an area of the lower active layer is greater than an area of the light emitting layer.

22. The apparatus as claimed in claim 18, wherein the upper charging electrode includes ITO.

23. The apparatus as claimed in claim 18, further comprising:
   a switching element having one end electrically connected to the lower charging electrode and the source or drain electrode; and
   a storage unit connected to another end of the switching element, the storage unit being configured to receive current stored in the lower active layer in response to a switching condition of the switching element.

* * * * *